(12) United States Patent
DesJardins et al.

(10) Patent No.: US 6,219,815 B1
(45) Date of Patent: *Apr. 17, 2001

(54) HIGH-SPEED SYNDROME CALCULATION

(75) Inventors: Philip A. DesJardins, Nevada City; Ravi G. Mantri, Grass Valley, both of CA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/506,995

(22) Filed: Feb. 18, 2000

Related U.S. Application Data (62) Division of application No. 09/009,480, filed on Jan. 20, 1998, now Pat. No. 6,058,500.

(51) Int. Cl.[7] .................................................. H03M 13/00
(52) U.S. Cl. ........................ 714/781; 714/782; 714/784; 714/785; 708/492
(58) Field of Search .................................. 714/752, 781, 714/784–785, 759, 761, 782; 708/492

(56) References Cited

U.S. PATENT DOCUMENTS

| | | | |
|---|---|---|---|
| 4,833,678 | 5/1989 | Cohen ................................. | 714/781 |
| 4,839,896 | 6/1989 | Glover et al. ........................ | 714/759 |
| 5,003,539 | * 3/1991 | Takemoto et al. ................... | 714/785 |
| 5,130,990 | 7/1992 | Hsu et al. . | |
| 5,642,367 | 6/1997 | Kao ..................................... | 714/784 |
| 5,712,861 | 1/1998 | Inoue et al. .......................... | 714/755 |
| 5,771,244 | 6/1998 | Reed et al. ........................... | 714/752 |
| 5,822,337 | 10/1998 | Zook et al. .......................... | 714/785 |
| 5,905,740 | * 5/1999 | Williamson ......................... | 714/784 |
| 6,026,420 | * 2/2000 | DesJardins et al. ................. | 708/492 |
| 6,101,520 | * 8/2000 | Lan et al. ............................ | 708/492 |

FOREIGN PATENT DOCUMENTS 0 496 157 A3    7/1992   (EP) .............................. H03M/13/00

OTHER PUBLICATIONS

Dabiri, et al. (Fast parallel algorithms for decoding Reed–Solomon codes based on remainder polynomials; IEEE, Jul. 1995).*

Cardarilli, et al. (Efficient modulo extraction for CRT based residue to binary converters; IEEE, Jun. 1997).*

Wong, et al. (Fast division using accurate quotient approximations to reduce the number of iterations; IEEE, Aug, 1992).*

* cited by examiner

Primary Examiner—Albert Decady
Assistant Examiner—Guy J. Lamarre
(74) Attorney, Agent, or Firm—McDonnell Boehnen; Hulbert & Berghoff (57) ABSTRACT

A method and device for calculating syndromes used in forward-error-correction codes. To calculate syndromes more quickly using a computer with memory access latency, the polynomial equation C(X) is divided by a generator polynomial G(X) to form a remainder polynomial R(X). The remainder polynomial R(X) is then used to speed the calculation of the syndromes. A method of dividing a Nth order dividend polynomial by a 2R order divisor polynomial is also described. In addition, to further speed the calculation of syndromes, the generating polynomial is split into a number of sub-polynomials $G_j(X)$ to yield a number of remainder sub-polynomials $R_j(X)$ used to calculate the syndromes. Calculation of syndromes using evaluation by Horner's rule and a generalization thereof is also described.

3 Claims, 8 Drawing Sheets

HIGH-SPEED SYNDROME CALCULATION

This is a divisional of application Ser. No. 09/009,480, filed Jan. 20, 1998, now U.S. Pat. No. 6,058,500.

BACKGROUND OF THE INVENTION

A. Field of the Invention

The present invention relates to a method and device for calculating Reed Solomon syndromes using a programmable logic computer.

B. Description of the Related Art

Digital data transmission systems are used in a variety of different applications ranging from transferring financial numbers representing dollar amounts in bank accounts, to storing the music of our favorite performs on compact digital audio discs, to communicating telemetry data with aircraft and orbiting space satellites. To transmit this type of information, digital transmission systems deliver a sequence of binary information to a receiver across a transmission channel. Due to impairments in the transmission channel (i.e., the inability of the transmission channel to accurately deliver the transmitted bits), the binary information may become corrupted or changed as they traverse the transmission channel. If the errors are undetected, the amounts in our bank accounts would be wrong, our favorite singers would be out of tune, and aircraft could be lost.

To prevent these problems, error detection schemes are employed to detect differences between the originally transmitted bits and the received data bits. When a transmission error is detected, the error detection scheme signals the transmitter to re-send the corrupted information. More advanced error detection schemes, known as Forward-Error-Correction ("FEC"), can detect and correct corrupted information without requiring the transmitter re-send the information. FEC codes are essential in systems where the re-sending of information is not possible or practical. For example, in a compact audio disc there is not sufficient time to re-send the digital audio information without affecting the sound quality; with deep space probes re-sending the information may take a great deal of time.

A Galois finite field is a defined number system composed of a finite number of elements. A Galois finite field of q elements is usually denoted as GF(q). The q number of elements in a Galois field are of the form $p^M$, where p is a prime integer and M is a positive integer.

Galois fields are particularly useful in FEC codes, such as Reed Solomon codes, for detecting and correcting errors in a transmitted sequence of binary information bits. For example, a sequence of binary information bits is first partitioned into a sequence of symbols, where each symbol is M-bits long. Each symbol is an element of a $2^M$ element Galois field, denoted as $GF(2^M)$. The symbols are further partitioned into groups of K number of symbols represented by $d_{K-1}, d_{K-2}, d_{K-3}, \ldots d_2, d_1, d_0$, where $d_{K-1}$ is first in the sequence (transmitted first in time) and $d_0$ last in the sequence (transmitted last). The sequence of transmitted symbols can thus be represented as a $(K-1)^{th}$ order polynomial:

$$D(X) = d_{K-1} + d_{K-2}X^{K-2} + \ldots + d_2X^2 + d_1X + d_0$$

where X is a symbol delay operator and the d's are the coefficients of a Galois Field polynomial.

To implement a FEC using Galois field polynomials, redundant symbols are appended to the message stream, increasing the message length from K to N. The group of N number of symbols is called a codeword, and can be represented as a $(N-1)^{th}$ order polynomial C(X). The methods for determining these redundant symbols are known to those skilled in the art of error correction and described in "Error Control Coding: An Introduction," by Peter Sweeney, Prentice Hall 1991 and "Theory and Practice of Error Control Codes," by Richard E. Balhut, Addison-Wesley Publishing Company, Inc., 1983, which are hereby incorporated by reference.

The transmitter transmits the codeword, which is received at the receiver, but is possibly corrupted by the impairments of the transmission channel.

The receiver implements the FEC by decoding the received symbols using the coefficients of a Galois Field polynomial. The received symbols are represented as coefficients of a Galois Field polynomial and a set of syndromes, which holds the keys for locating errors in the input message stream, is calculated. I the syndromes calculated at the receiver are all zeros, the transmitted bit stream was received without any error. If the syndromes differ, an error exists in the received symbols. In a FEC code, the syndromes can also be used to determine the erroneous bits and correct them without requiring the message to be re-transmitted. The specifics of locating and correcting errors are known to those skilled in the art and described in the above texts.

Among the operations to be performed in FEC decoding are calculating a set of 2R symbols, called syndromes, for each received codeword. A common technique of calculating syndromes divides the C(X) polynomial by each of the 2R first order factors $(X+a_i)$ of the generator polynomial, where the value of i ranges from i=0 to i=(2R-1). Polynomial division is performed by long dividing the polynomial by the first order factors of the generator polynomial in a fashion similar to ordinary long division. To divide an (N-1)th order polynomial by a first order polynomial requires N-1 polynomial multiplications of the divisor polynomial (by the next digital in the quotient) to yield a product, and then N-1 subtractions of the product from the current remainder to yield a new remainder. The process repeats until the product can no longer be subtracted from the remainder. The division operation of the polynomial must be performed 2R times, that is, once for each of the first order factors of the generator polynomial G(X).

To implement the polynomial multiplication used in the polynomial division operation, a pre-computed multiplication table $L_i$ can be created for each of the first order polynomials factors of the generator polynomial $(X+a_i)$ and stored by the computer in memory. The multiplication look-up table $L_i$ is $2^M$ elements long and contains the product of the input (index j) with the first order polynomial $(X+a_i)$:

$$L_i(j) = j*(X+a_i)$$

In practice, for a small value of I, that is a small number of first order factors to evaluate the polynomial, typically I=2R, a set of I multiplication tables are created. The polynomial evaluation process can then perform multiplication by indexing and retrieving the result in the proper multiplication table stored in computer memory.

To calculate the set of syndromes for a codeword using a FEC code requires 2R division operations, each using (N-1) multiplications for a total of 2R*(N-1) multiplications required to calculate the set of syndromes. Using a look-up table, each multiplication requires a memory access to return the result of the multiplication. In computer processors having a long latency in performing memory accesses, this method of calculating polynomials may require a large amount of processor computation time. For example, a digital signal processor performing the multiplication by accessing the multiplication look-up table stored in memory may require a T number of memory clock cycles to return the result of the operation. The total processor time to calculate the syndromes is thus 2R(N−1)T clock cycles. For an application such as an Asymmetric Digital Subscriber Line ("ADSL") as specified by the ANSI T1E1.413 standard, R=8 and N=254 which may be a prohibitive amount of time to calculate syndromes for each codeword. This amount of computational processing required may preclude a software implementation unless there is a method or system to simplify the calculations.

Accordingly, it would be desirable to reduce the amount of time necessary to perform the syndrome calculations.

SUMMARY OF THE INVENTION

The present invention addresses the problem of evaluating polynomial equations to determine syndromes used in FEC codes for detecting and correcting errors in transmitted data. In accordance with the present invention, the calculation of syndromes using a programmable logic computer can be simplified using the exemplary methods and devices described herein. The described methods and devices may reduce the computational complexity to enable a software implementation of the syndrome calculation. Implementing the syndrome calculation in software may enable a data decoder to be produced with less complex hardware and therefore more inexpensively.

In the described method, a syndrome used in FEC codes is calculated by forming a remainder polynomial R(X) of the division of the C(X) polynomial by a generator polynomial G(X):

$$R(X)=C(X) \text{ modulo } G(X)$$

Rather than calculating the syndromes using the large (N−1)th order C(X) polynomial as the dividend, the lower-order remainder polynomial R(X) can be used to calculate the syndromes. The remainder polynomial R(X) is a (2R−1)th order polynomial that the present invention teaches can be used to reduce the number of calculations required to evaluate the syndromes. The calculation or division using the larger (N−1)th order C(X) polynomial is performed only once to obtain the remainder polynomial R(X). The smaller (2R−1)th order R(X) polynomial can then be used to calculate the syndromes. In certain types of computer processors requiring latent memory accesses, using the lower-order remainder polynomial R(X) may significantly reduce the computational burden of calculating syndromes used in FEC codes such as Reed Solomon codes.

In another aspect of the invention, the computational burden required to divide a (N−1)th order polynomial by a 2Rth order polynomial can be made to be no greater than the division of a (N−1)th order polynomial by a first order polynomial, when both these calculations are constrained by the latency in accessing computer memory. In this case, the exemplary methods and devices can reduce the computation time required to calculate the FEC syndromes. Described is a method for dividing a dividend polynomial by a divisor polynomial to calculate a remainder polynomial such that the computation time is dictated by the order of the dividend polynomial, and is largely independent of the divisor polynomial. Polynomial division is typically an iterative process of forming a product of the divisor polynomial and subtracting the product from a current remainder to form a new remainder. The process repeats sequentially until the product of the divisor polynomial becomes larger than the current remainder. In the described embodiment, the iterative method of multiplication and subtraction of the multiplication product from a current remainder uses the memory access latency of the computer processor to overlap the calculation of different iterations to allow normally sequential iterations to operate in parallel. By initiating a plurality of latent memory accesses and overlapping the subtraction operations of the previous iteration with the latent memory access of the next iteration, the computation time required to divide a polynomial is dependent on the order of the dividend polynomial dictating the number of iterations.

In yet another aspect of the invention, the generator polynomial G(X) is factored into a plurality of generator sub-polynomials $G_j(X)$ and the dividend polynomial C(X) is then divided by $G_j(X)$ to form a plurality of remainder sub-polynomials $R_j(X)$ that are of a lower order than the remainder polynomial R(X). To form the syndromes, the lower order remainder sub-polynomials $R_j(X)$ can then be evaluated using Horner's Rule and the generalized form of Horner's Rule described herein. Using the remainder sub-polynomials $R_j(X)$ instead of remainder polynomial R(X) for calculating the syndromes further reduces the computation time required.

In the exemplary device for calculating syndromes, a decoder includes a polynomial division means and a polynomial calculation means. The polynomial division means calculates a remainder polynomial R(X) of the division of a polynomial with a generator polynomial. The polynomial calculation means calculates the syndromes using the remainder polynomial R(X) and the first order factors of the generator polynomial.

In yet another aspect of the invention, an improvement of speed polynomial evaluation using Horner's Rule for evaluating polynomials is described. In the exemplary embodiment, the polynomial to be evaluated is split into a plurality of sub-polynomials. The sub-polynomials can be simultaneously evaluated and summed to form the result of the polynomial evaluation. A method and device is described.

BRIEF DESCRIPTION OF THE DRAWINGS

The foregoing and other objects, features and advantages of the present invention will be more readily appreciated upon reference to the following disclosure when considered in conjunction with the accompanying drawings, in which.

DETAILED DESCRIPTION OF THE PREFERRED EMBODIMENT

Figure 1:
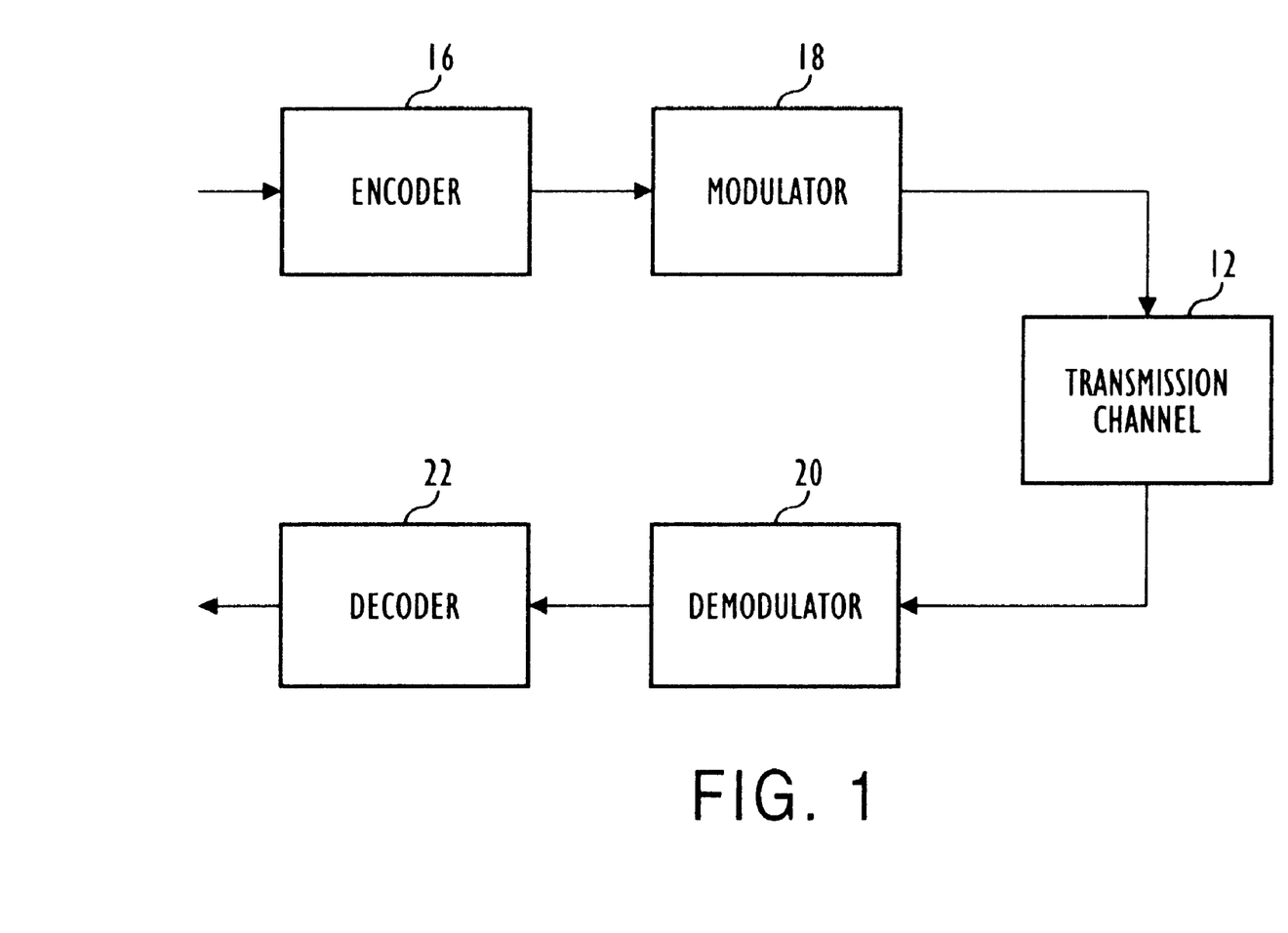
FIG. 1 shows an exemplary data transmission system for transmitting digital data in accordance with an aspect of the present invention.

FIG. 1 shows an exemplary data transmission system 10 for transmitting digital data in accordance with the present invention. The transmission channel 12 may not have a frequency bandwidth sufficient to directly convey digital information signals, so the digital data is modulated by a modulator 18 to a format that can be conveyed by the transmission channel 12. Various modulation techniques such as pulse amplitude modulation, frequency modulation, phase modulation, quadrature amplitude modulation may be utilized with the present embodiment.

The transmission channel 12 introduces a number of unwanted effects, such as attenuation, distortion, interference and noise to the signal, which corrupts the transmitted information. Because the channel 12 introduces errors corrupting the transmitted data, the data are encoded 16 to provide error detection and correction. The encoding process may involve a number of stages and incorporate other coding techniques known to those skilled in the art. The present invention focuses in particular on error coding techniques to combat the distortion and corruption of digital data caused by the impairments of the transmission channel. It will be apparent to those of skill in the art that the techniques and devices described herein may be used in conjunction with other forms of encoding.

In the preferred embodiment, digital data are presented to the encoder 16 in frames consisting of a fixed number of symbols. Each symbol input to the encoder 16 simply represents a bit or a number of M bits. Encoder 16 preferably adds a number of symbols to the digital data to create a codeword enabling error control and correction. Thus, the output of the encoder 16 generally contains more symbols than the input, meaning redundancy has been added to the signal. The redundant symbols added by the encoder 16 may be determined by dividing the message polynomial by a generating polynomial as used in Reed Solomon or BCH codes, which are known to those skilled in the art. The demodulator 20 and decoder 22 perform complementary operations to the encoder 16 and the modulator 18 to recover the originally transmitted digital data.

Figure 2:
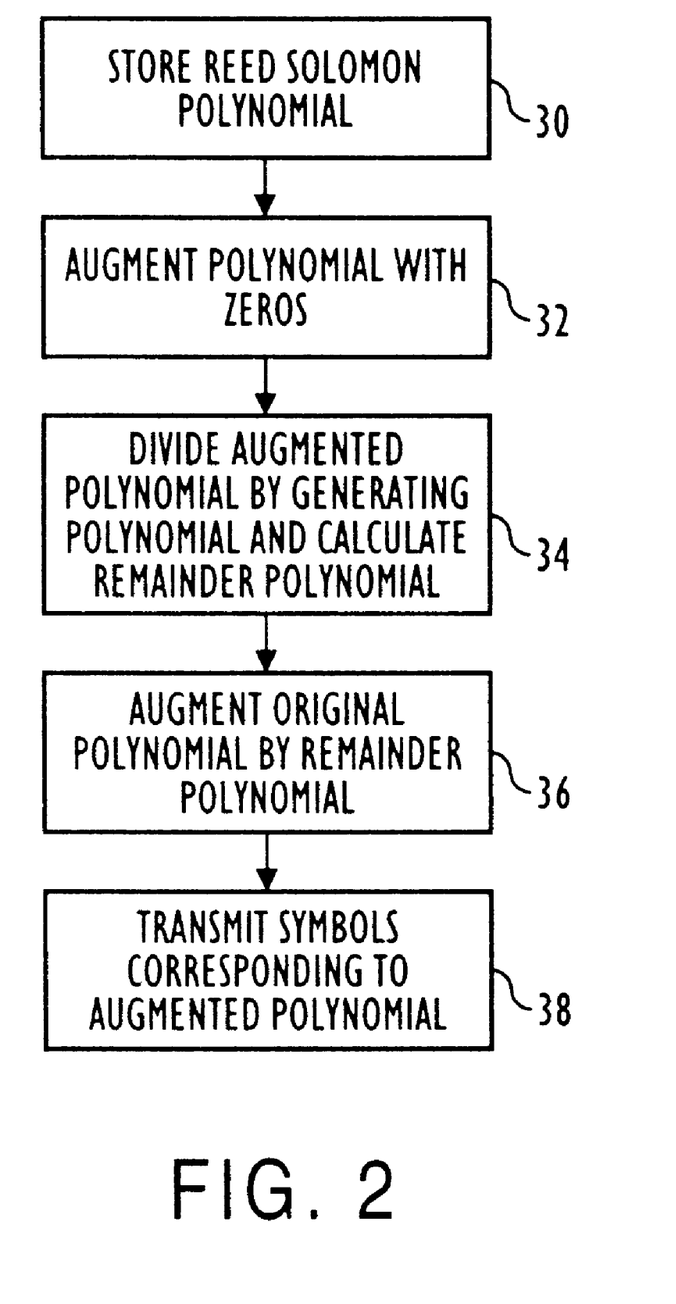
FIG. 2 shows a flow chart embodying an illustrative method of encoding in accordance with an aspect of the invention shown in FIG. 1.

FIG. 2 shows a flow chart of a method sued by the encoder 16 to add Reed Solomon coding to a sequence of message symbols to provide a error detection and correction. At step 30, the computer processor of the encoder stores the message polynomial D(X) in computer memory for subsequent operations and calculations. The message polynomial D(X) may be stored in an array in computer memory or registers where they can be quickly accessed for computations by the computer processor.

At step 32, the stored message polynomial D(X) is augmented by adding a number of zero symbol coefficients. In this example, 2R zero symbols are added to the D(X) polynomial to create a (N−1)th order polynomial. Adding 2R zero symbols is equivalent to multiplying the message polynomial D(X) by $X^{2R}$. Multiplying $D(X)*X^{2R}$ also yields a (N−1)th order polynomial, where K+2R=N. The coefficients can also be shifted by manipulation in random access memory or by shift register(s). Alternatively, zeroes may simply be appended to the polynomial coefficients.

At step 34, the augmented polynomial $D(X)*X^{2R}$ is divided by a generator polynomial G(X) to form a remainder polynomial R(X), where:

$$R(X)=(D(X)*X^{2R}) \text{ modulo } G(X)$$

The divisor generator polynomial G(X) is of the order 2R, forming a remainder polynomial R(X) of the order 2R−1. The generator polynomial G(X) and methods of performing the division operation to form a remainder polynomial R(X) using a computer processor will be described in more detail in connection with the complementary operation of the decoder 22 in FIG. 3.

At step 36, the original message polynomial D(X) is augmented by the remainder polynomial R(X) to form a transmitted polynomial T(X) corresponding to original message symbols augmented by 2R redundant symbols:

$$T(X)=D(X)*X^{2R}+R(X)$$

where, $$R(X)=(D(X)*X^{2R}) \text{ modulo } G(X)$$

and thus, $$T(X)=D(X)*X^{2R}+(D(X)*X^{2R}) \text{ modulo } G(X)$$

At step 38, the transmitted polynomial T(X) of message symbols D(X) augmented with the redundant R(X) symbols can then be modulated by the modulator 18 for transmission across the transmission channel 12 (FIG. 1).

Referring again to FIG. 1, the transmitted sequence of symbols represented by the polynomial T(X) is received by the demodulator 20. The demodulator 20 demodulates the received sequence of symbols which can be represented by the polynomial C(X). The sequence of received symbols represented by the polynomial C(X) is decoded by the decoder 22 to recover the message symbols D(X).

Figure 3:
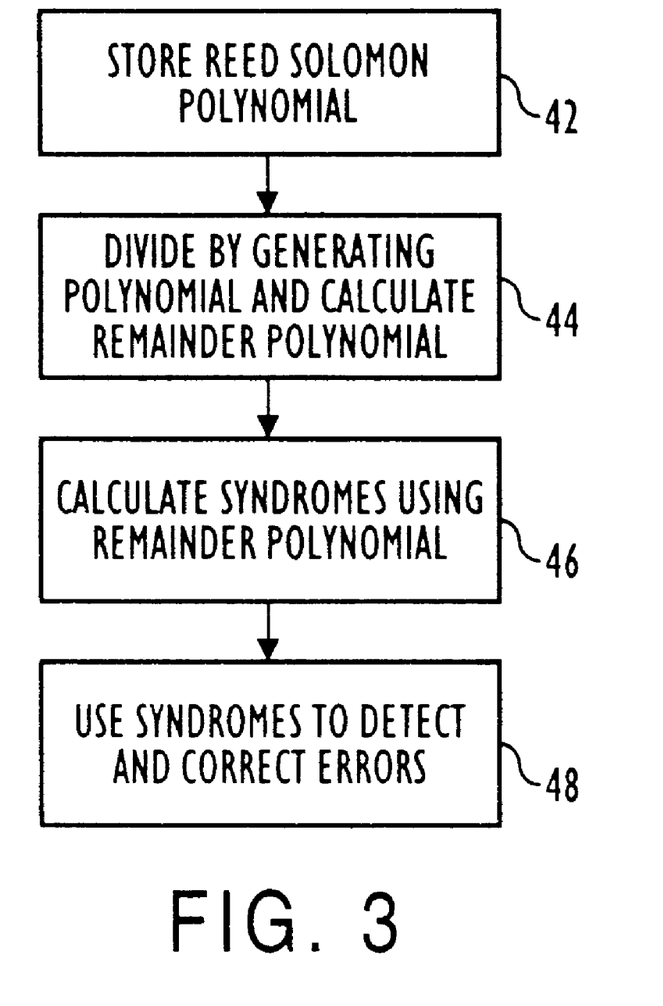
FIG. 3 shows a flow chart embodying an illustrative method of decoding in accordance with an aspect of the invention shown in FIG. 1.

Referring now to FIG. 3, described is a flow chart of a method used by a decoder 22 of the present embodiment to calculate the syndromes used in a FEC code for determining the originally transmitted symbols T(X) from the received message symbols C(X). After the originally transmitted symbols T(X) are determined the original message symbols D(X) can be recovered.

At step 42, the coefficients representing the received symbols C(X) are stored into computer registers, a memory array in random access memory, shift registers, or other suitable computer memory storage devices. A computer central processing unit with a data bus and addressable memory may perform this function. Preferably, the received polynomial C(X) coefficients are stored in memory that is readily accessible by the computer processor such as registers or cache memory.

At step 44, the polynomial C(X) is divided by the generator polynomial G(X) to form a remainder polynomial R(X):

$$R(X)=C(X) \text{ modulo } G(X)$$

The general selection and use of generator polynomials G(X) are well known to those skilled in the art and described in the texts incorporated by reference. Generally, a generator polynomial G(X) is a 2R order polynomial such that:

$$G(X)=(X+a_0)*(X+a_1)* \ldots (X+a_{2R-2})*(X+a_{2R-1})$$

The values of $a_i$ are defined by the particular FEC coding scheme and generator polynomial used to encode the transmitted message. Generally, it is known that $a_i$ is equal to $\alpha^{i-L}$, where $\alpha$ is a primitive element of the field $GF(2^M)$ and L is an integer (often 0 or 1) defined by the coding scheme.

Thus, the division of the (N−1)th order polynomial C(X) by the 2R order generator polynomial G(X) forms a remainder polynomial R(X) of an order less than the divisor generator polynomial G(X). Given the division of a (N−1)th order polynomial C(X) is by a 2R order polynomial G(X), the remainder polynomial R(X) is a (2R−1)th order polynomial. The remainder polynomial R(X) is thus a considerably lower order polynomial than the C(X) polynomial. For example, in the current T1E1.413 recommendation for Asymmetric Digital Subscriber Lines ("ADSL") the values of R=8 and N=254. The C(X) polynomial is thus a $254^{th}$ order polynomial and the remainder polynomial R(X) only a $15^{th}$ order polynomial.

At step 46, the smaller remainder polynomial R(X) is used in the polynomial calculation to form the syndromes. The (2R−1)th order remainder polynomial R(X) is divided by the first order factors $(X+\alpha^i)$ of the generator polynomial to form remainders to yield the syndromes of the Reed Solomon error correction code. There are 2R first order factors $(X+\alpha^i)$ of the generator polynomial, each of which are used to calculate the 2R syndromes. There are two preferred ways in which the polynomial calculation can proceed, either by polynomial division of the remainder polynomial R(X) by the 2R first order factors $(X+\alpha^i)$, or alternatively by polynomial evaluation of the remainder polynomial at $X=\alpha^i$, for i=0 to 2R−1. Due to implementation considerations, polynomial evaluation is generally preferred over polynomial division. A more complete discussion of polynomial calculation and implementation will be discussed below in more detail.

At step 48, the calculated syndromes are used to recover the originally transmitted message symbols D(X). The 2R remainders of the divisions of R(X) by the first order factors $(X+\alpha^i)$ of the generator polynomial G(X), referred to as syndromes, are used to detect errors and recover the originally transmitted symbols. The syndromes are used in algorithms such as the Berlekamp-Massey algorithm to locate and correct errors in the received sequence of symbols. The specifics of locating and correcting errors are known to those skilled in the art and described in the above-identified texts.

The method described in connection with FIG. 3 can be used to reduce the computational requirements of evaluating the set of syndromes used in a Reed Solomon FEC code. In the exemplary method described above, the initial calculation to determine the polynomial R(X) involves the division of the $(N-1)^{th}$ order polynomial C(X) by the 2R order generator polynomial G(X). In another aspect of the present invention the computation time to divide the $(N-1)^{th}$ order polynomial by the 2R order polynomial is not significantly greater than division of the $(N-1)^{th}$ order polynomial by th first order polynomial. Moreover, the subsequent divisions of the smaller $(2R-1)^{th}$ order remainder polynomial R(X) by the first order factors of the generator polynomial require significantly less computations than dividing the $(N-1)^{th}$ order polynomial by the first order polynomials, resulting in a savings in computer computation time. Particularly in computer processors having a memory latency delay in accessing memory, such as the TMS320C6x family of processors from Texas Instruments, the division of polynomials by higher-order polynomial divisors may be implemented to consume the same amount of computation time as long division by lower-order polynomial divisors. Using these types of computer processors and the method described below, the computation time to divide a polynomial is dictated primarily by the order of the dividend polynomial and is largely independent of the order of the divisor polynomial. In this case, where the computation time is dependent on the order of the dividend polynomial and independent of the divisor polynomial, the use of the smaller $(2R-1)^{th}$ order polynomial R(X) rather than the larger $(N-1)^{th}$ order polynomial C(X) to calculate the syndromes reduces the computational burden significantly.

Figure 4:
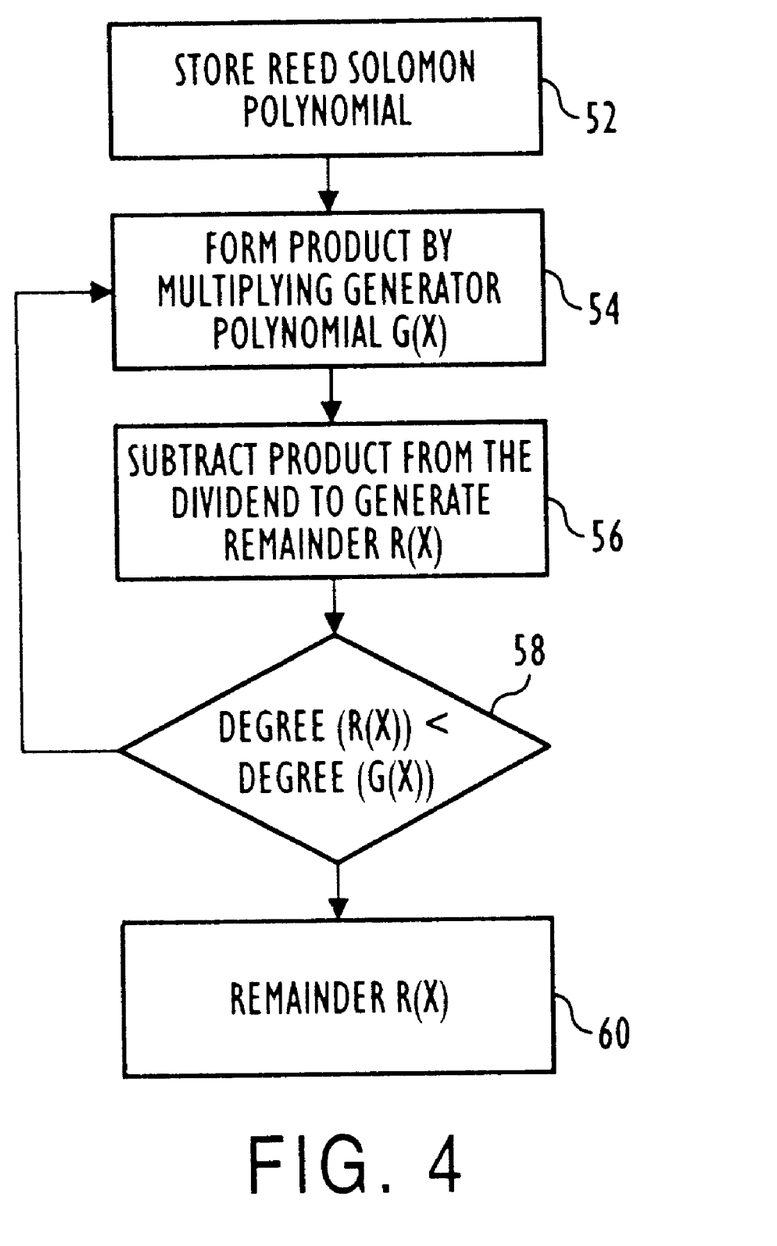
FIG. 4 shows a flow chart of an exemplary method of polynomial division in accordance with an aspect of the invention shown in FIG. 1.

Referring now to FIG. 4, described is a portion of an iterative method of dividing a (N−1)th order polynomial which may be used in the division operation 44 of FIG. 3. This overlapping iterative method renders the computation time of the polynomial division operation dependent primarily on the order of the dividend polynomial. The iterative method uses a pre-computed multiplication lookup table stored in a computer memory. The computer processor may incur a latency to access the multiplication table stored in computer memory. The latent memory access operation in processors such as the TMS320C6x is utilized to overlap or allow parallel iterations of memory access and computer processor operations to reduce the computation time required to perform polynomial division operation.

At step 52, the Reed Solomon polynomial C(X) is stored in computer memory before performing the subsequent calculations, as described previously.

At step 54, the division of the polynomial C(X) by the generator polynomial G(X) requires multiplying the generator polynomial G(X) by a current quotient to form a product. Preferably, the multiplication operation is implemented using a pre-computed multiplication table stored in computer memory. Generally, the multiplication is implemented by accessing computer memory to index the multiplication table at the location containing the desired product of the generator polynomial. Several computer clock cycles may be required to return the result of the access of the multiplication table, as described below in more detail.

At step 56, the multiplication product is subtracted from the dividend polynomial C(X) to generate a remainder. At step 58, the process repeats, subtracting the product of the generator polynomial from a current remainder, until the current remainder is of a smaller degree than the generator polynomial and the product of the generator polynomial can no longer be subtracted from the current remainder. If the generator polynomial G(X) is still of smaller degree than the remainder, the process repeats finding the largest product of the generator polynomial that will divide into the current remainder at step 54. The generator polynomial G(X) is multiplied again to form a new product that is subtracted from the remainder to form a new remainder. At step 60, when the degree of the generator polynomial G(X) becomes greater than the degree of the remainder, the division or modulo process is completed, and the current remainder becomes the final remainder polynomial R(X).

In this exemplary embodiment, the products of the multiplication of the generator polynomial G(X) of step 54 are obtained by pre-computing a multiplication look-up table of the products of the generator polynomial G(X) and storing the multiplication table in computer memory. Because the polynomial G(X) is a 2R order polynomial, each product in the multiplication table will have 2R+1 symbols corresponding to the coefficients of the products of G(X)*i. The $i^{th}$ entry in the table will contain the 2R+1 coefficients of the product G(X)*i. The multiplication table is thus indexed by i to determine the product of the generator polynomial i*G(X). To form the product of the generator polynomial G(X) used in the polynomial division operation, the most significant symbol of the current remainder is sued as i to index the multiplication table. It should be noted that a simplification to reduce the width of the 2R+1 multiplication table to a 2R width multiplication table is available. In the division operation, the result of the subtraction to form the remainder will always cancel out the most significant symbol. Accordingly, the most significant digit of the products from the multiplication table are not necessary and do not need to be calculated or stored in the multiplication table. The width of the multiplication table can thus be reduced to 2R.

With a processor such as the TMS320C6x family of processors from Texas Instruments, accessing the multiplication product in computer memory may require several computer clock cycles. In the TMS320C6x family of processors the data bus has a width of 32 bits which allows only a partial product of 4 symbols of a Galois Field $GF(2^M)=256$, to be acquired per memory access. To look-up the 2R=16 symbols from the multiplication table thus requires 4 successive memory cycles to return all 16 symbols of the multiplication product. If the 4 most significant symbols are returned first, the 4 most significant symbols of the product can be subtracted from the 4 most significant symbols of the remainder to determine the most significant symbols of the new remainder without awaiting the subsequent memory accesses returning the lessor significant symbols of the product. The most significant symbol of the new remainder may then be used to initiate the next iteration and memory access to the multiplication look-up table, without awaiting the look-up of the entire product from the previous iteration. During the idle memory latency access time of the next iteration, the lessor significant symbols of the memory access from the previous iteration become available and the subtraction of the lessor significant symbols can be performed to complete the previous iteration. In this manner, by overlapping the subtraction of the least significant symbols from the previous iteration with the memory access of the next iteration, the computation time of the division operation is dependent primarily on the size or order of the dividend polynomial. The dividend polynomial, in this case the message polynomial C(X), dictates the number of multiplications and latent memory accesses that must be performed to complete the division operation. The size of the divisor polynomial, in this case the generator polynomial G(X), does not limit the computation time because the subtraction operations that are due to the divisor polynomial G(X) can be overlapped with the latent memory accesses dependent on the dividend polynomial C(X). Thus, the computation time of the division operation is limited by the dividend polynomial C(X) and not the divisor polynomial G(X).

In the present example where the values of N=254 and R=8, first division of the Nth order divisor polynomial by the 2R order generator polynomial G(X) requires 254 calculations. Using the $16^{th}$ order remainder polynomial R(X) in the syndrome calculation rather than the 254th order polynomial C(X), however, saves 254−16=238 computations for each of the syndrome calculations. With 2R=16 syndromes to calculate, a savings of over 3500 calculations can be realized in computing the set of syndromes.

Figure 5:
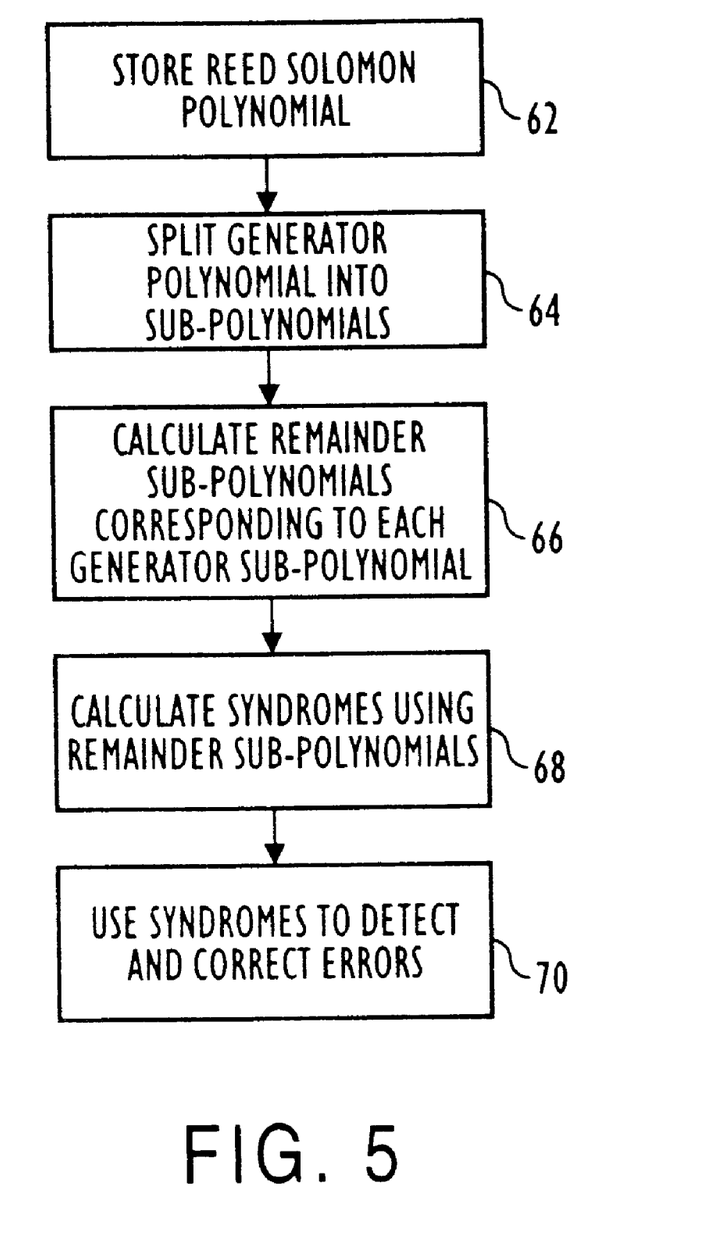
FIG. 5 shows a flow chart of an exemplary method of calculating remainders in accordance with the present invention used in the system of FIG. 1.

Now referring to an alternate embodiment shown in FIG. 5, further gains in computational speed of calculating syndromes in Reed Solomon codes may be achieved by splitting the generator polynomial G(X) into a plurality of generator sub-polynomials $G_j(X)$ of a lower order than the generator polynomial. As an illustrative example, described is a specific case where N=254 and 2R=16 redundant bytes. It should be understood, however, that the same technique can be applied to any values of N and R.

At step 62 the coefficients of the polynomial C(X) are stored in computer memory as previously described.

At step 64, the generator polynomial G(X) is split or divided into J number of sub-polynomials $G_j(X)$, where in this example J=4:

$$G(X)=G_1(X)*G_2(X)*G_3(X)*G_4(X)$$

In the case of 2R=16, the generating polynomial G(X) is of the form:

$$G(X)=(X+\alpha^0)*(X+\alpha^1)* \ldots (X+\alpha^{14})*(X+\alpha^{15})$$

Splitting the polynomial G(X) results in the sub-polynomials $G_j(X)$ equal to:

$$G_1(X)=(X+\alpha^0)*(X+\alpha^1)*(X+\alpha^2)*(X+\alpha^3)$$

$$G_2(X)=(X+\alpha^4)*(X+\alpha^5)*(X+\alpha^6)*(X+\alpha^7)$$

$$G_3(X)=(X+\alpha^8)*(X+\alpha^9)*(X+\alpha^{10})*(X+\alpha^{11})$$

$$G_4(X)=(X+\alpha^{12})*(X+\alpha^{13})*(X+\alpha^{14})*(X+\alpha^{15})$$

At step 66, the polynomial C(X) is divided by the J generator sub-polynomials $G_j(X)$ to calculate J remainder sub-polynomials $R_j(X)$. Let $Q_j(X)$ be the quotient polynomial formed by the division of C(X) by $G_j(X)$ and $R_j(X)$ be the remainder polynomial. Then for j=1 to j=4.

$$C(X)=Q_j(X)*G_j(X)+R_j(X)$$

The remainder sub-polynomials $R_j(X)$ are shorter (2R/J−1), or $3^{rd}$ order polynomials in this example, which can be used in the syndrome calculation in the manner similar to that described in FIG. 3. Because the $R_j(X)$ sub-polynomials are of a smaller order than the (2R−1)th order remainder polynomial R(X), further computational savings may be realized by using the smaller $R_j(X)$ sub-polynomials to calculate the syndromes. Using a processor with latent memory access operations and the parallel iterative division method of FIG. 4, the computational burden for the first step of generating four remainder polynomials $R_j(X)$ from C(X) is approximately the same as that of generating one $15^{th}$ order polynomial R(X) from C(X). However, the subsequent steps of evaluating the lower order sub-polynomials yields a significant reduction in computation time as $R_j(X)$ are $3^{rd}$ order polynomials and R(X) is a $15^{th}$ order polynomial. The parameter J in this method can be optimally chosen by those of skill in the art depending on the values of N, R, the number of ALUs that can operate in parallel in the processor, and the look-up latency of the processor.

Alternatively, the generator polynomial G(X) can also be split in factors of varying order to form remainder polynomials of unequal order. For example, the $16^{th}$ order generator polynomial G(X) can be split into three factors, two polynomials of the $4^{th}$ order and one of the 8th order. Or the generator polynomial G(X) could be split into factors of a $7^{th}$ order polynomial, a $6^{th}$ order polynomial and a $3^{rd}$ order polynomial. The disclosed method is equally valid for all such cases.

At step 68, the remainder polynomials are calculated preferably using polynomial evaluation. In polynomial arithmetic, polynomial division by $(X+\alpha^i)$ is equivalent to polynomial evaluation at $X=\alpha^i$. Polynomial evaluation can thus be substituted for polynomial division. Since $G(\alpha^i)=0$, it can easily be seen that the syndromes are:

$$Si=C(\alpha^i)=R(\alpha^i); \text{ for } i=0 \text{ to } i<=15$$

The 2R syndromes can also be calculated with fewer computations using polynomial evaluation of $R_j(X)$, as follows:

$S_i=C(\alpha^i)=R_1(\alpha^1)$, for $i=0$ to $i=3$ $S_i=C(\alpha^i)=R_2(\alpha^1)$, for $i=4$ to $i=7$ $S_i=C(\alpha^i)=R_3(\alpha^1)$, for $i=8$ to $i=11$ $S_i=C(\alpha^1)=R_4(\alpha^1)$, for $i=12$ to $i=15$ A method for evaluating the syndromes using Horner's rule is described in more detail below.

At step 70, the syndromes are sued with algorithms, such as the Berlekamp-Massey algorithm, to locate and correct errors in the received symbols. The specifics of locating and correcting errors are known to those skilled in the art and described in the above-identified texts.

Figure 6:
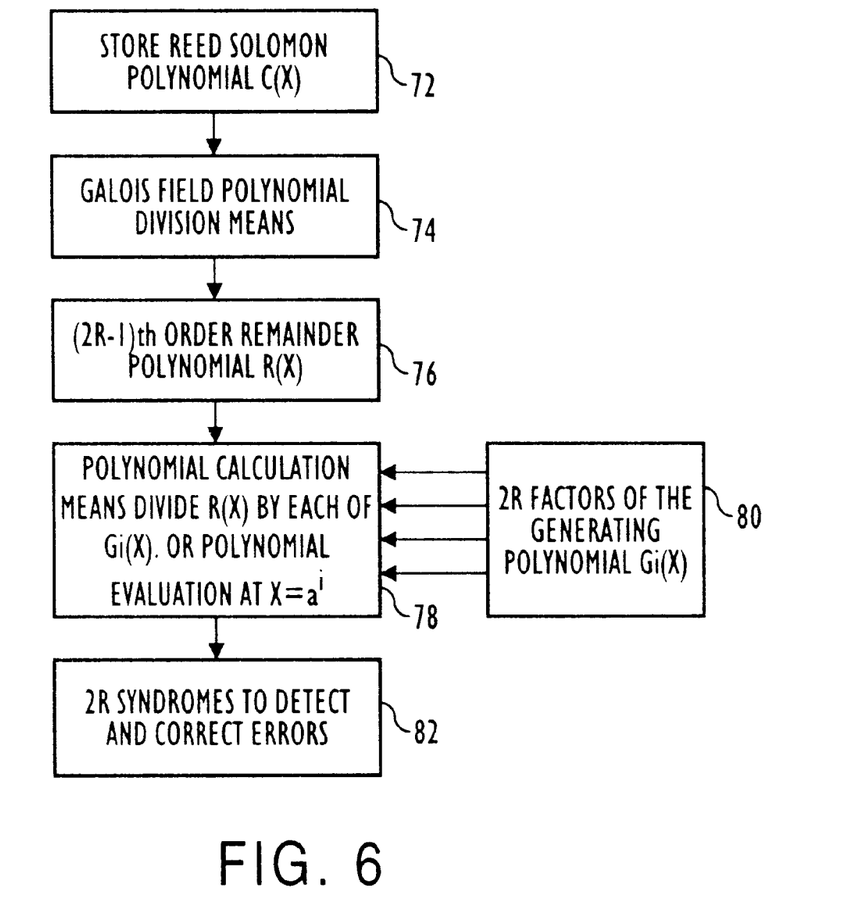
FIG. 6 shows a block diagram of an illustrative device in accordance with the present invention used in the system of FIG. 1.

Referring now to FIG. 6, a device for performing the syndrome calculation is described. The present embodiment includes a polynomial division means 74 for performing polynomial division such as the division of the stored polynomial C(X) 72 by the generator polynomial G(X) to form a (2R−1)th order remainder polynomial R(X) 76, and a polynomial calculation means 78 for calculating a polynomial to form the 2R syndromes 82. Generally, polynomial division procedures are known to those skilled in the art and the polynomial division means can be implemented with hardware such as combinational logic and software using a pre-computed multiplication look-up table as previously described. Preferably, the polynomial division means 74 implements the overlapped iterative polynomial division procedure described with reference to FIG. 4.

The generator polynomial G(X) is generally of the form:

$$G(X)=G_1(X)*G_2(X)* \ldots *G_{2R}(X)=(X+\alpha^0)*(X+\alpha^1)* \ldots *(X+\alpha^{15})$$

where $G_i(X)=(X+\alpha^i)$ for $i=0$ to $15$.

The first order factors of the generator polynomials are primitive elements of a Galois field $GF(2^M)$ used in the FEC scheme.

The polynomial calculation means 78 calculates the 2R syndromes 82 in two principal ways. The remainder polynomial R(X) 76 may be divided by each of the 2R first order polynomials $(X+\alpha^i)$ 80 to form the syndromes 82. Alternatively, the polynomial calculation means 78 may evaluate the remainder polynomial 76 at values of $X=\alpha^i$. Preferably, the polynomial calculation means 78 performs polynomial evaluation using Horner's rule.

Horner's rule, states that a polynomial equation $C(X)=c_{N-1}X^{N-1}+c_{N-2}X^{N-2}+ \ldots -c_xX^2+c_1X+c_0$ can be evaluated for a value of $X=\alpha^i$ through a recursion which requires only addition and a sequential multiplication by the same value of $\alpha^i$. To evaluate the 2R syndromes, the polynomial is evaluated at $X=\alpha^i$, for $i=0$ to $(2R-1)$. The polynomial C(X) can be factored or broken down into:

$$C(\alpha^i)=( \ldots ((c_{N-1}\alpha^i+c_{N-2})\alpha^i+c_{N-3})\alpha^i+ \ldots +c_i)\alpha^i+c_0$$

As seen from the above recursive formula, the only multiplication required by the polynomial is multiplication by $\alpha^i$. In the recursive formula, $c_{N-1}$ is multiplied by $\alpha^i$ and $c_{N-2}$ is added. The result of the addition is multiplied by $\alpha^i$ again, and $c_{N-3}$ is added. This operation simply repeats N−1 times with each iteration having two steps: (1) the outcome of the previous step is multiplied by $\alpha^i$ and (2) $c_k$ is added to the result of the multiplication. Of course, the addition and multiplication used to evaluate these polynomials do not follow the rules of ordinary addition and multiplication, but are Galois Field addition and multiplication.

Because evaluation of the polynomial equation using Horner's rule requires only the multiplication by $\alpha^i$, a multiplication table $L_i$ can be created for the products of $\alpha^1$ and stored by the computer in memory. For example, the multiplication look-up table $L_i$ contains the product of the input (index j) with $\alpha^1$:

$$L_i(j)=j*\alpha^i.$$

In practice, for a small value of R, that is a small number of $\alpha^i$'s to evaluate the polynomial, a set of 2R multiplication tables are created and stored in computer memory. The polynomial evaluation process can then perform multiplication by indexing and retrieving the result in the proper multiplication look-up table.

In another aspect of the invention, a method to improve the calculation speed of polynomial evaluation using Horner's rule is available. Horner's rule is a highly sequential process because each step is dependent on the outcome of the previous step, i.e., each iteration of multiplication and addition depends on the result of the previous iteration. Thus the polynomial equation must be evaluated serially, awaiting the outcome of the previous iteration before the next iteration can proceed. Accordingly, the rate at which the polynomial can be evaluated by a programmable computer is thus limited because each iteration of Horner's rule must be evaluated in serial fashion. In computer processors having a long latency in performing memory accesses, this method of evaluating polynomials can be inefficient. As previously described, a digital signal processor performs the multiplication by accessing the multiplication look-up table stored in memory. To return the product of a multiplication using the multiplication look-up table, however, the processor may require a number of memory clock cycles. Meanwhile, the processor sits idle awaiting the result of the multiplication look-up table because each iteration of the polynomial calculation depends on the result of the previous iteration.

Figure 7:
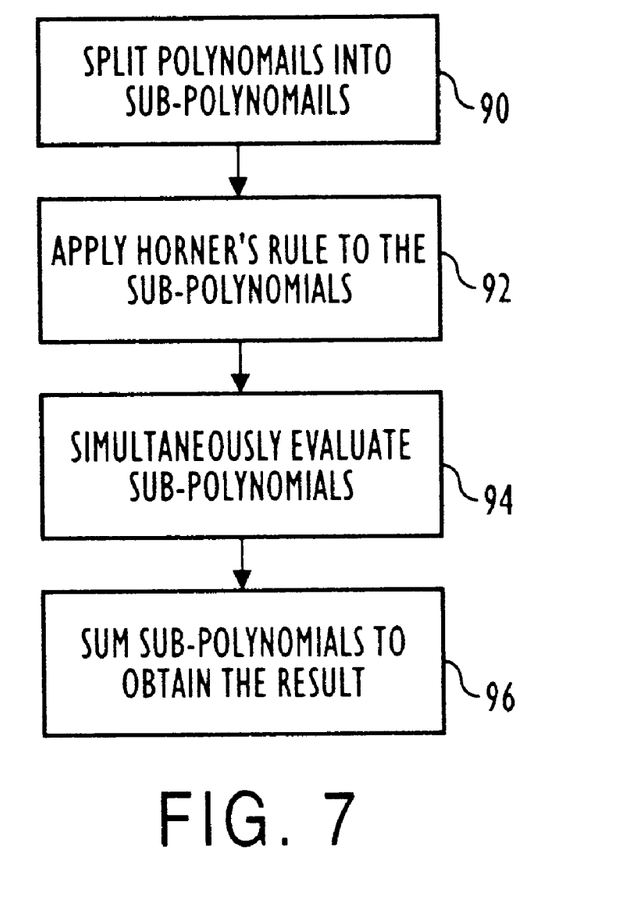
FIG. 7 shows a flow chart of an illustrative method of complementing the device of FIG. 6.

Referring now to FIG. 7, a flow chart of a generalized method for improving the evaluation of polynomials using Horner's rule is shown. The improvement to Horner's rule involves splitting the polynomial to be evaluated R(X) into a number of sub-polynomials.

At step 90, the polynomial to be evaluated is split into a plurality of k sub-polynomials. For example, the polynomial R(X) may be split or divided into two sub-polynomial equations: a first sub-polynomial equation with the even-order terms and a second sub-polynomial with the odd-order terms.

$$R(X)=R_{EVEN}(X)+X*R_{ODD}(X), \text{ where}$$

$$R_{EVEN}(X)=r_0+r_2X^2+r_4X^4+$$

$$R_{ODD}(X)=r_1+r_3X^2+r_5X^4+$$

Horner's rule is applied to each sub-polynomial equation to overlap or simultaneously evaluate the sub-polynomial equations. When Horner's rule is applied to the even-order terms for instance:

$$R_{EVEN}(X)=( \ldots ((r_{MAXEVEN}X_i^2+r_{MAXEVEN-2})X_i^2+ \ldots )X_i^2+r_4)X_i^2+r_2)X_i^2+r_0$$

In this case, the iterative multiplier is $X_i^2$ rather than $X_i$. $R_{MAXEVEN}$ is the coefficient corresponding to the highest even power of the polynomial R(X). Horner's rule is also applied to the odd-order terms:

$$R_{ODD}(X)=( \ldots ((r_{MAXODD}X_i^2+r_{MAXODD-2})X_i^2+ \ldots )X_i^2+r_5)X_i^2+r_3)X_i^2+r_1$$

Thus, the $R_{EVEN}(X)$ and $R_{ODD}(X)$ sub-polynomials are simultaneously evaluated. Evaluating the sub-polynomial with the odd-order terms $R_{ODD}(X)$ is only slightly more complicated than the even-order terms $R_{EVEN}(X)$. The sub-polynomial evaluation of the odd-order terms may be initiated by multiplying the highest odd-order term coefficient by $X_i$, or multiplying the final result by $X_i$. Because this multiplication is performed only once during the sub-polynomial evaluation, it may be performed using slower hardware or software without unduly increasing the overall evaluation time.

The technique of splitting a polynomial into even and odd terms can be generalized into splitting the polynomial into a greater number of sub-polynomials to provide more parallelism. For example, the polynomial may also be split or divided into three sub-polynomials and evaluated using the iterative multiplier $X_i^3$, or into four sub-polynomials using the iterative multiplier $X_i^4$, and so forth. Generally, the polynomial can be split into k sub-polynomials where the coefficients of the sub-polynomials come from each $k^{th}$ coefficient of the original polynomial. Without loss of generality we may assume that N is a multiple of k and split the polynomial $R(X)$ into k sub-polynomials of degree L=(N/k-1):

$$R(X) = r_0 + r_k X^k + r_{2k} X^{2k} + r_{3k} X^{3k} \ldots + r_{Lk} X^{Lk} + r_1 X +$$
$$r_{k+1} X^{k+1} + r_{2k-1} X^{2k+1} + r_{3k+1} X^{3k+1} \ldots + r_{Lk+1} X^{Lk+1} + r_2 X^2 +$$
$$r_{k+2} X^{k+2} + r_{2k+2} X^{2k+2} + r_{3k+2} X^{3k+2} \ldots + r_{Lk+2} X^{Lk+2} \ldots +$$
$$r_{k+1} X^{k+1} + r_{2k+1} X^{2k+1} + r_{3k+1} X^{3k+1} + \ldots + r_{Lk+k+1} X^{Lk+k+1}$$

The optimal amount of partitioning k depends on the cycle time of the loop performing the new-coefficient addition and the multiplication look-up of Horner's rule, which is dependent on the latency of the processor memory access. A greater level of partitioning is desirable with processors having longer memory latency.

The result for each sub-polynomial is initialized to the coefficient of the highest degree term in that sub-polynomial:

Result[$m$]=R[$Lk+m$], for all $m$=0 to $k$−1.

At step 92, Horner's rule is applied to evaluate each sub-polynomial. The evaluation of the sub-polynomials are overlapped, meaning that the evaluation of one sub-polynomial is initiated until it encounters a latent memory access. At step 94, rather than awaiting the outcome of the memory access, which may take several clock cycles to complete, the evaluation of a second sub-polynomial is initiated to overlap the calculation of the first sub-polynomial. The second sub-polynomial can be evaluated until it also requires a latent memory access. If the memory access of the first polynomial evaluation has completed, the processor may return to the evaluation of the first polynomial. If the memory access is not complete, the evaluation of another sub-polynomial can be initiated until k sub-polynomials are being evaluated. As will be appreciated by those of skill in the art, latency in memory access can be compensated by partitioning and overlapping the evaluation of sub-polynomials. The greater the degree of memory latency, the more partitioning k can be made. Partitioning should stop when all the cycles for each sub-polynomial are initiating a memory look-up.

Horner's rule is applied L times to each sub-polynomial. The sub-polynomial evaluation operation is:

Result[$m$]=Result[$m$] * $X_i^k$+R[$(L-j)k+m$]

where j is the iteration variable though the loop, j=1 to L. Of course, the "*" operator is GF multiplication and "+" is GF addition.

After the loop for the sub-polynomial is performed, each Result [m] is modified by polynomial multiplication by $X^m$ for all m=0 to k−1. Because this multiplication is performed only once per evaluation, it can be implemented with more general purpose hardware.

At step 96, when each sub-polynomial evaluation has been completed, the k modified Result[m] * $X^m$ results are summed together to form the final polynomial result.

The described method can be implemented in software as demonstrated by the following pseudo code except:

/* Without loss of generality, let's assume N is a multiple of k. If N is not a multiple of k, higher-order zero coefficient terms are appended to R(X) so that N becomes a multiple of k */

L=(N/k)−1;
/* Initiate Horner's rule */
for (m=0; m<k; m++)
   Result[m]=R[L*K+m];
/* Loop through applying Horner's Rule */
/* Result[m]=Result[m] * $X_i^k$+R[(L−j)k+m] */
for (j=1; j<=L; j++)
for (m=0; m<k; m++)
   Result[m]=GfSum(GfMultiByXiToTheK(Result[m]), R[(L−j)k+m]);
/* Modify Results */
for (m=0; m<k; m++)
   Result[m]=GfMult(Result[m], XiToThe[m]);
/* Sum Results Together to Get polynomial Result */
FinalResult=Result[0];
for (m=1; m<k; m++)
   FinalResult=GfSum(Result[m], FinalResult);

In the above pseudo code, the array XiToThe[m] contains the value of $X_i^m$ for m=0 to k−1, and the function GfMultiByXiToTheK is a function preferably optimized to multiply the input by $X_i^k$, preferably using a look-up table. Although described as a function, it may preferably be implemented as inline code.

While the present embodiment has been described as a method, it is easily implemented as hardware in the form of a custom gate array or an application specific integrated circuit (ASIC). A variety of software, firmware, and hardware can be used to implement the embodiments described herein. For example, the described methods may be implemented in the processor's assembly language or in a high-level C or C++ programming language by those of skill in the art. The software may be compiled, stored, and executed in either firmware or a disk-based operating system. In a representative embodiment, the described software is implemented in assembly language to run on a digital signal processor. Of course, a microcontroller or a personal computer may also be suitable. The software may be stored and executed in either firmware or a disk-based operating system.

Figure 8:
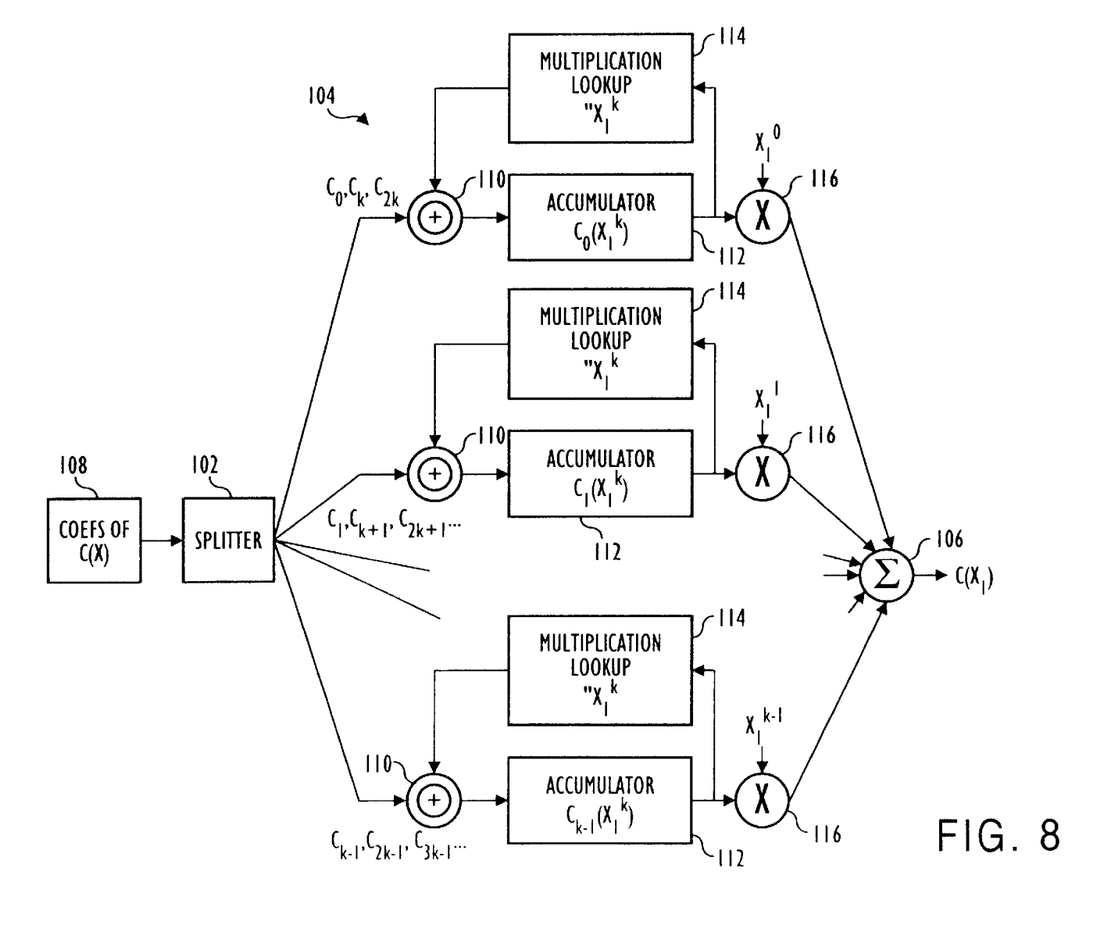
FIG. 8 shows a block diagram embodying an illustrative device in accordance with the aspect of the invention shown in FIG. 7.

Now referring to FIG. 8, illustrated is a hardware or firmware apparatus for speeding the evaluation of syndromes of polynomials such as Galois field polynomials used in error correction schemes. This illustrative embodiment includes a splitter 102, a device for evaluating sub-polynomials 104, and a summer 106. As seen in FIG. 8, a plurality of hardware for evaluating sub-polynomials is depicted and used to provide overlapping, parallel evaluation of the sub-polynomial equations. The operation of the device is coordinated by control logic (not shown) implementing the methods described above to evaluate the polynomial. The control logic can be software, firmware or hardware programmed to implement the methods described in FIG. 7.

To begin the evaluation, the polynomial coefficients 108 are split by the splitter 102 into a number of sub-polynomials and supplied to a device for evaluating the sub-polynomials 104. The splitter 102 can be embodied in software, firmware or hardware implementing the methods described herein. For example, the coefficients of the polynomial C(X) (where X may be equal to $\alpha^i$ in this example) can be stored in an array of memory location C[i] (for i=0 to N−1) in computer memory. The polynomial coefficients C[i] are split into k sub-polynomials $C_m(X_i^k)$, for m=0 k−1, by having k indices into the array of coefficients C[i]. Each index is separated by 1 and is incremented by k. A means of delivering the sub-polynomial coefficients to the device for evaluating the sub-polynomials 104 is not explicitly shown but could be implemented as an addressing unit in a computer processor.

The device for evaluating the sub-polynomials 104 includes adders 110, accumulators 112, a multiplier 114, and a final multiplier 116. The adders 110 implement the addition operation in Horner's rule by adding coefficient values $c_0$, $c_k$, $c_{2k}$, etc. to the result of the multiplication products $c_k X^k$, $c_{2k} X^{2k} c_{3k} X^{3k}$, etc. The adders 110 receive the coefficient values $c_0$, $c_k$, $c_{2k}$ from the splitter 102 and the multiplication products from the multiplier 114 and accumulator 112. Of course, the adders implement polynomial addition in $GF(2^M)$, such as modulo-2 addition rather than ordinary addition. The result of the adders 110 is supplied to the accumulators 112 for the next iteration of multiplication and addition. The adders 110 can be implemented in software or simply in hardware by an exclusive-or (XOR) logic gate.

The accumulators 112 maintain the current value of $C_j(X_1^k)$ during the evaluation of the sub-polynomials. For example, the accumulators 112 receive the result of the adders 110 and maintains the current value of $C_j(X_i^k)$ during the multiplier 114 operation. The accumulator 112 may be embodied by registers, a stack, or simply memory locations in random access memory.

Multiplier 114 multiplies the current value of $C_j(X_1^k)$ by $X_i^k$ is preferably implemented as a plurality of multiplication look-up tables $L_1$ containing products of $X_i^k$. The multiplication look-up tables $L_i$ contain the results of multiplications over the Galois field $GF(2^M)$. During polynomial evaluation, the look-up table $L_i(n)$ is indexed by the current value of $C_j(X_i^k)$ to yield the product $X_i^k C_j(X_i^k)$ as required in the generalized Horner's rule. Preferably, the accumulators 112 share copies of the multiplication look-up table $L_i$ to save on the memory required to maintain multiple copies of the table $L_i$. A number of different multiplication look-up tables used for the differing values of $X_i$ can be maintained in a memory storage device such disk drive and moved into random access memory as needed.

Final multiplier 116 multiplies the final $C_j(X_i^k)$ accumulator results by $X_i^j$ and the summer 106 sums the results together to yield the result of the polynomial evaluation $C(X_i)$. The final multiplier 116 and summer 106 operate only once per polynomial evaluation and can therefore be implemented using slower, more general-purpose hardware or software. As with the addition operation, an arithmetic logic unit of a computer processor can be used to perform the multiplication operation. Dedicated hardware such as combinational logic, can also be used to implement the final multiplier 116 and summer 106.

To coordinate the operation of the apparatus, control logic to control the addressing and sequencing of the addition and multiplication operations carrying out the polynomial evaluation using Horner's rule is implemented using software, firmware, or hardware. Software implementing the operations described in connection with FIGS. 6 and 7 may be implemented by those skilled in the art with the aid of the Figures and descriptions herein. Likewise, digital hardware design using custom gate arrays or programmable logic arrays can be used to implement the desired functions.

The described methods and apparatus provide the ability to speed the evaluation of polynomials by splitting the polynomials into a number of sub-polynomials that can be simultaneously evaluated. The evaluation of the sub-polynomial can thus be performed such that the latency time during the multiplication look-ups are utilized to evaluate other sub-polynomials. In this fashion, a number of sub-polynomials can be simultaneously evaluated to more quickly obtain the result of the polynomial evaluation. In implementations where access to the multiplication look-up tables require multiple clock cycles to complete but can be initiated every clock cycle, the described embodiments can yield considerable improvements in speed.

It is to be understood that both the foregoing general description and the following detailed description are exemplary and explanatory and are intended to provide further explanation of the invention as claimed. Numerous modifications and variations are possible. It is intended that the foregoing detailed description be regarded as illustrative rather than limiting. It is the following claims, including all equivalents, which are intended to define the scope of this invention.

We claim:

1. A method of dividing a dividend polynomial by a divisor polynomial using a table of pre-computed products of the generating polynomial using a programmable computer that returns a partial product of the most significant symbols and a partial product of the lessor significant symbols from the table of pre-computed products, comprising the steps of iteratively:

indexing the table of pre-computed multiples of the dividend polynomial for a product of the dividend polynomial;

obtaining the partial product of the most significant symbols from the step of indexing, the partial product containing the most significant symbols of the product of the dividend polynomial;

subtracting the most significant symbols of the partial product from a remainder to form the most significant symbols of a new remainder before obtaining a second partial product of the lessor significant symbols from the step of indexing, the second partial product containing the lessor significant symbols of the product of the dividend polynomial; and indexing into the table of the pre-computed multiples of the dividend polynomial using the most significant symbols of the new remainder to form a new partial product;

wherein the subtracting step from a previous iteration is performed during a time when a latent memory operation is accessing the table of pre-computed products for the next iteration.

2. The "method" of claim 1 wherein the divisor polynomial comprises a generator polynomial used in a FEC.

3. The "method" of claim 1 wherein the dividend polynomial corresponds to transmitted symbols in a transmission system.

* * * * *